(12) United States Patent
Sasaki et al.

(10) Patent No.: US 8,580,126 B2
(45) Date of Patent: Nov. 12, 2013

(54) PIEZOELECTRIC VIBRATING PIECES COMPRISING EDGE MESA STEPS, AND METHODS FOR MANUFACTURING SAME

(75) Inventors: Hiroyuki Sasaki, Saitama (JP); Kenji Shimao, Saitama (JP); Manabu Ishikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 217 days.

(21) Appl. No.: 13/030,394

(22) Filed: Feb. 18, 2011

(65) Prior Publication Data

US 2011/0203083 A1    Aug. 25, 2011

(30) Foreign Application Priority Data

Feb. 24, 2010   (JP) .................................. 2010-038193
Mar. 25, 2010   (JP) .................................. 2010-069446

(51) Int. Cl.
  *C23F 1/00*   (2006.01)
(52) U.S. Cl.
  USPC ........ 216/2; 216/11; 216/13; 216/27; 216/41; 438/52; 438/53; 438/603; 438/700; 438/750
(58) Field of Classification Search
  USPC ............ 216/11, 2, 27, 41; 29/25.35; 310/344, 310/367; 430/5; 438/52, 603, 700, 750; 850/58
  See application file for complete search history.

(56) References Cited

U.S. PATENT DOCUMENTS

| 5,738,757 A * | 4/1998 | Burns et al. ................... 438/603 |
| 2003/0071542 A1 | 4/2003 | Satoh et al. |
| 2005/0194352 A1* | 9/2005 | Satoh et al. ..................... 216/41 |

FOREIGN PATENT DOCUMENTS

JP    2002-018698    1/2002

OTHER PUBLICATIONS

Office Action for related Japanese Patent Application No. 2010-069446, 3 pages, Feb. 6, 2012.

\* cited by examiner

*Primary Examiner* — Duy Deo
*Assistant Examiner* — Erin Bergner
(74) *Attorney, Agent, or Firm* — Klarquist Sparkman, LLP

(57) ABSTRACT

An exemplary method for a producing a piezoelectric vibrating piece having at least one mesa step includes forming a metal film on a main surface of a piezoelectric wafer. A through-groove is formed through the thickness of the wafer to form a plan profile of a desired piezoelectric substrate. A film of photoresist is formed on the surface of the metal film. A resist is applied, exposed, and formed into a resist pattern that defines a first mesa step along at least a portion of the plan profile. In regions not protected by the metal film, the piezoelectric substrate is etched to a defined depth to form a mesa step. The denuded edge surface of the metal film is edge-etched. A second mesa step, inboard of the first mesa step, can be formed by repeating the edge-etching and substrate-etching steps using the metal film as an etch protective film.

19 Claims, 11 Drawing Sheets

FIG.4
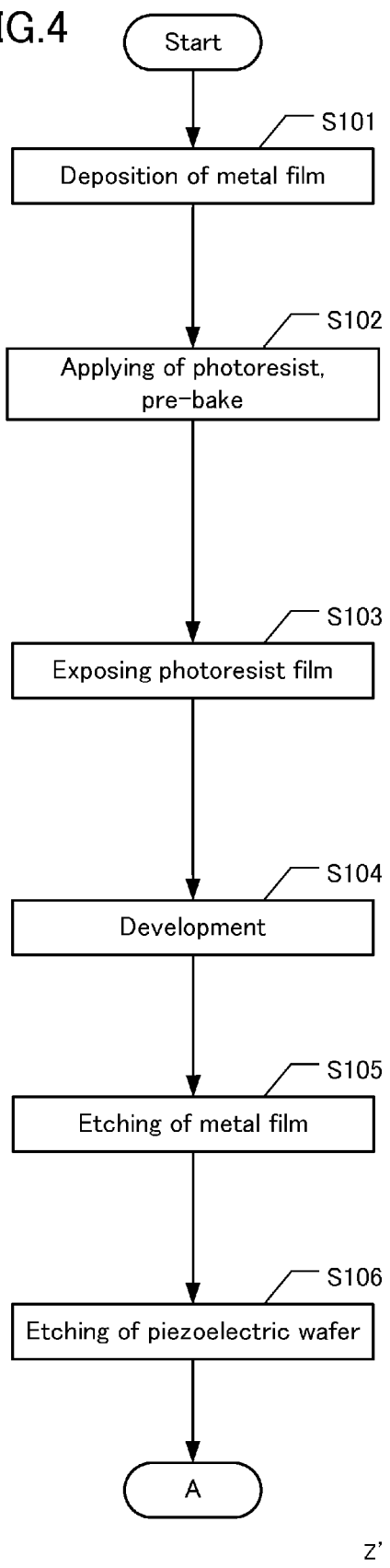
- Start
- S101 Deposition of metal film
- S102 Applying of photoresist, pre-bake
- S103 Exposing photoresist film
- S104 Development
- S105 Etching of metal film
- S106 Etching of piezoelectric wafer
- A
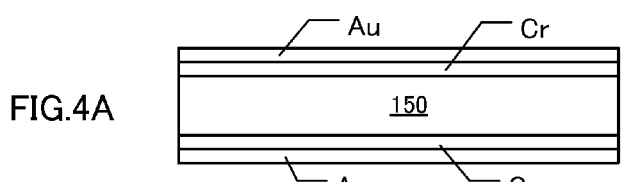
FIG.4A
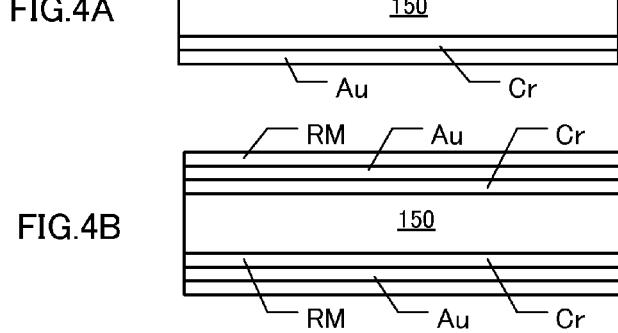
FIG.4B
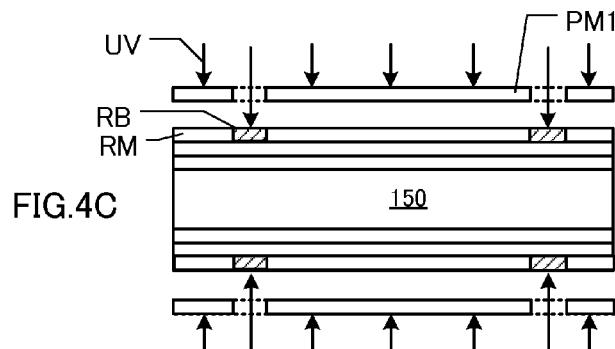
FIG.4C
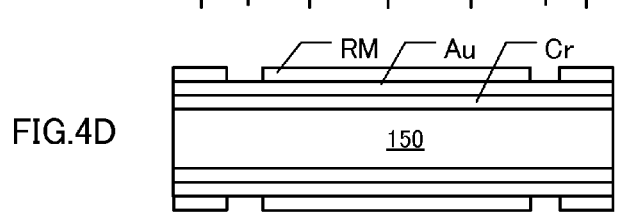
FIG.4D
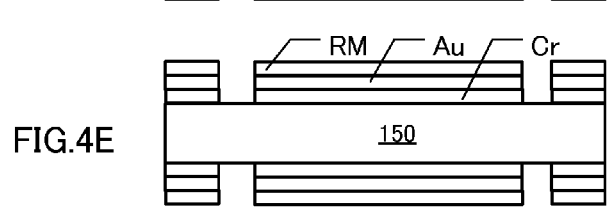
FIG.4E
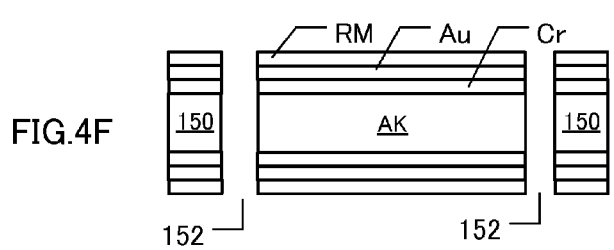
FIG.4F FIG. 5
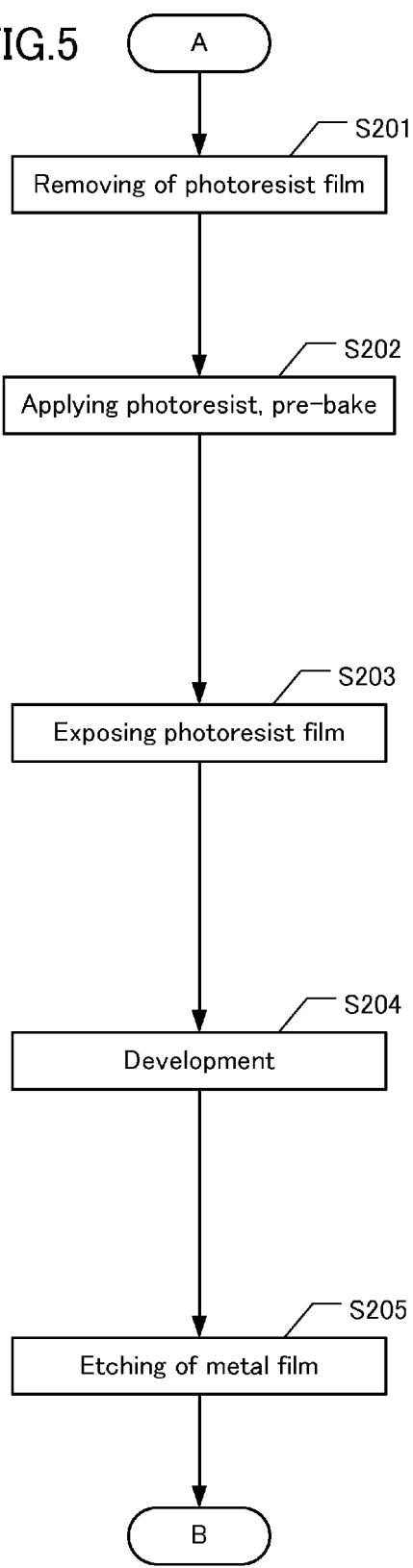
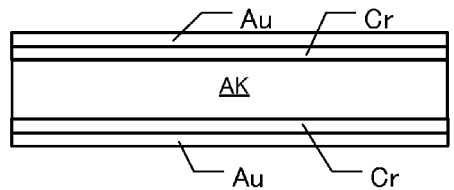
FIG. 5A
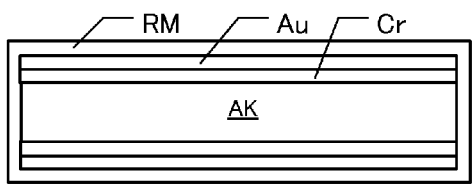
FIG. 5B
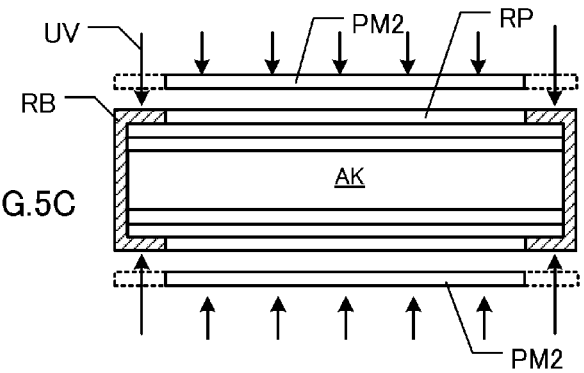
FIG. 5C
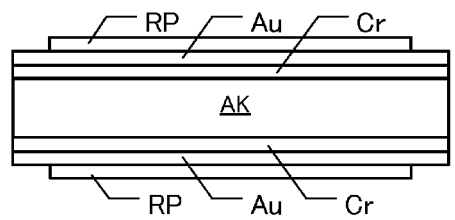
FIG. 5D
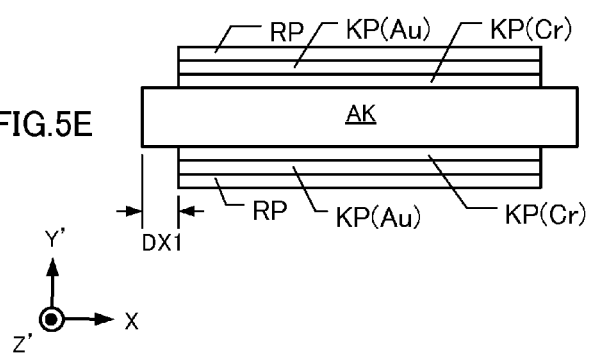
FIG. 5E FIG. 6
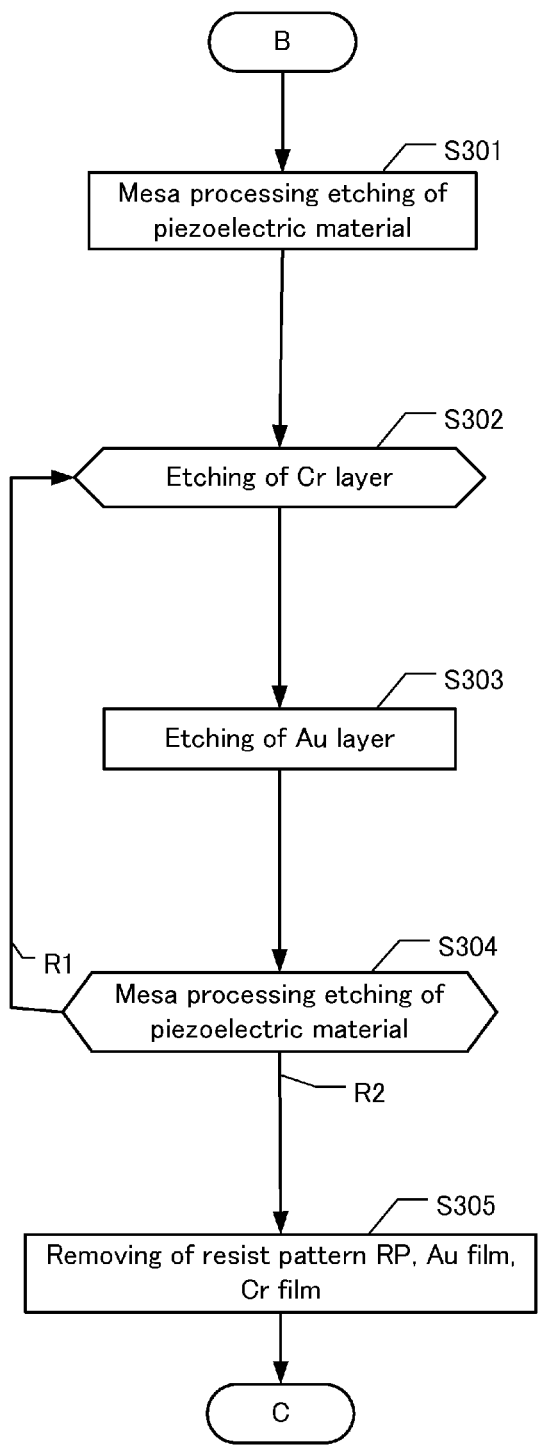
- B
- S301: Mesa processing etching of piezoelectric material
- S302: Etching of Cr layer
- S303: Etching of Au layer
- S304: Mesa processing etching of piezoelectric material
- R1, R2
- S305: Removing of resist pattern RP, Au film, Cr film
- C
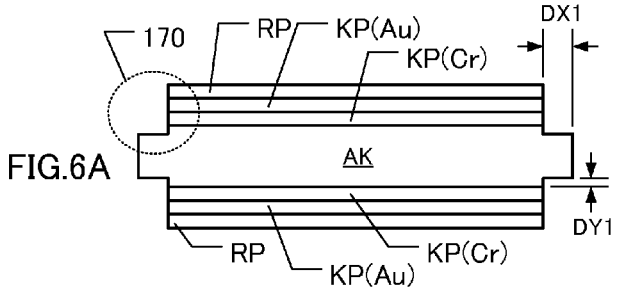
FIG.6A
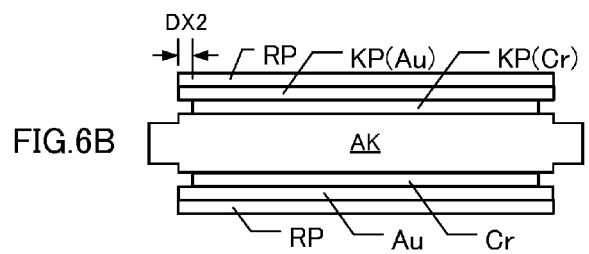
FIG.6B
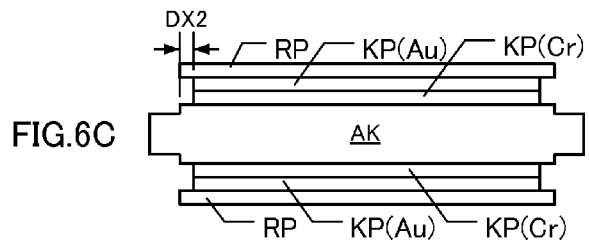
FIG.6C
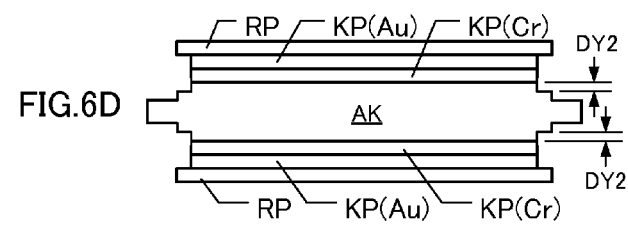
FIG.6D
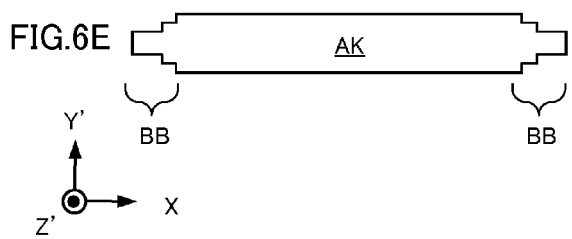
FIG.6E

PIEZOELECTRIC VIBRATING PIECES COMPRISING EDGE MESA STEPS, AND METHODS FOR MANUFACTURING SAME

CROSS-REFERENCE TO RELATED APPLICATION

This application claims priority to and the benefit of Japan Patent Application No. 2010-038193, filed on Feb. 24, 2010, and Japan Patent Application No. 2010-069446, filed on Mar. 25, 2010, in the Japan Patent Office, the disclosures of which are incorporated herein by reference in their respective entireties.

FIELD

This disclosure relates to, inter alia, methods for manufacturing piezoelectric vibrating pieces that include at least one step region ("mesa step") along at least one edge thereof.

DESCRIPTION OF THE RELATED ART

An AT-cut crystal vibrating piece is known as a "thickness shear vibrating piece." Piezoelectric vibrators accommodating such piezoelectric vibrating pieces within their respective packages or piezoelectric oscillators accommodating such piezoelectric vibrating pieces (and respective oscillating circuits) within their respective packages are commonly used in different types of electric devices as standard frequency sources. The frequency range of conventional piezoelectric vibrators and piezoelectric oscillators is generally 2 MHz to 100 MHz. These devices also have been miniaturized, which has imposed certain manufacturing challenges. For example, to make a piezoelectric vibrating piece having a vibration frequency of less than or equal to 5 MHz, "bevel processing" is performed in some instances to relieve edges of the piezoelectric vibrating piece by forming bevels (sloped edges) on the peripheral edges of the main surface of the piezoelectric vibrating piece. Bevel processing and a somewhat similar technique called "convex processing" are examples of "curve processing" as practiced in the art.

Curve processing, such as bevel or convex processing as disclosed in Japan Unexamined Patent Application No. 2002-018698, forms a beveled or otherwise sloped edge around the periphery of the piezoelectric vibrating piece. A beveled edge is formed by a method generally called "barrel polishing," in which the peripheral edges of the main surfaces of the piezoelectric vibrating piece are polished by placing multiple piezoelectric vibrating pieces and an abrasive into a spherical, cylindrical, or drum-shaped polishing chamber and rotating the chamber. In the rotating chamber the abrasive rounds ("relieves") the edges. Upon completion of polishing, excitation electrodes are formed on each piezoelectric vibrating piece.

For forming appropriately beveled edges, the polishing chambers must be sized and configured according to the size of piezoelectric vibrating pieces to be polished in them. In other words, it is inappropriate from a manufacturing standpoint to use the same chamber for polishing many different sizes of vibrating pieces or for polishing small quantities of them. Also, since electrodes must be formed individually on each piezoelectric vibrating piece after completing barrel polishing, these techniques are not suitable for mass production.

This invention solves the foregoing problems by providing, inter alia, methods for manufacturing piezoelectric vibrating pieces that allow increased mass production while forming appropriate edge relief on each piece.

SUMMARY

In solving the problems summarized above, a first aspect of this invention is directed to methods for manufacturing piezoelectric vibrating pieces. An embodiment of such a method is performed on a wafer made of a piezoelectric material, from which individual piezoelectric vibrating pieces are produced that include a respective excitation electrode on each main surface thereof. On each surface of a piezoelectric wafer a respective metal film is formed. A through-groove is formed on the piezoelectric wafer that defines outer edges of a piezoelectric substrate. The piezoelectric substrate includes a first main surface, a second main surface, and respective peripheral regions extending from each main surface to respective edges. A film of resist is formed on the metal film on at least one main surface of the piezoelectric substrate. The resist is exposed through a photomask that defines a resist pattern for a first mesa step in at least one peripheral region on the main surface, thereby forming a resist pattern. Using the resist pattern as an etch-protecting mask, the metal film is selectively etched to form a pattern in the metal film. Using the metal-film pattern as an etch-protective film, the piezoelectric substrate is etched a first depth to form a first mesa step and also denuded edges of the metal film. The first mesa step is inboard of the respective outer edge. Further using the resist as an etch-protectant, the denuded edges of the metal film are edge-etched a defined distance to produce corresponding denuded regions of the piezoelectric substrate. Using the metal-film pattern as an etch-protectant, the denuded regions of the piezoelectric substrate are etched to a second depth to form a second mesa step located inboard of the first mesa step. Thus, the piezoelectric substrate becomes step-wise thinner from the main surfaces to the second mesa step to the first mesa step.

The metal film can include a first metal layer formed on the respective main surface of the piezoelectric substrate and a second layer formed on the first layer.

Etching the metal film can comprise etching the first metal layer and then etching the second metal layer.

Etching the metal film can comprise etching only the first metal layer.

The method can further comprise forming multiple second mesa steps by repeating, at least once, the steps of edge-etching the metal film and etching denuded regions of the piezoelectric substrate.

The steps from the forming the resist pattern to forming the second mesa step can be performed on one main surface or on both main surfaces of the piezoelectric substrate.

An excitation electrode can be formed on the piezoelectric substrate after forming the second mesa step, wherein the electrode-forming step is performed while the piezoelectric substrate is mounted to the piezoelectric wafer.

Another embodiment of the subject method is directed to manufacturing a piezoelectric vibrating piece including a piezoelectric substrate made of a piezoelectric material and including an excitation electrode formed on a main surface of the piezoelectric substrate. In the method a first metal layer is formed on a main surface of a piezoelectric wafer. A second metal layer is formed on the first metal layer, thereby forming a metal film on the main surface. A through-groove is formed that extends through a thickness dimension of the wafer. This groove defines edges of a piezoelectric substrate attached to the wafer and exposes edge surfaces of the metal film along the edges of the substrate, wherein the substrate includes respective peripheral regions located adjacent the edges. The edge surface of the first metal layer is "edge-etched" to denude at least one respective peripheral region of the substrate. Using remaining metal film as an etch-protective film, the at least one denuded peripheral region is etched to form a respective first mesa step.

The method can further comprise, after edge-etching the first metal layer but before etching the at least one denuded peripheral region, edge-etching the second metal layer.

The method can further comprise repeating, at least once, the steps of etching the first metal layer and edge-etching the at least one denuded peripheral region to form multiple mesa steps.

Performing a subject method results in manufacture of a piezoelectric vibrating piece having appropriate edge relief around the periphery of its main surface, in a way that can be performed in a mass-production manner.

BRIEF DESCRIPTION OF THE DRAWINGS

FIG. 4 is a flow-chart of a first portion of the method embodiment.

FIGS. 4A-4F depict the results of respective steps in the flow-chart of FIG. 4.

FIG. 5 is a flow-chart of a second portion of the method embodiment, continued from FIG. 4.

FIGS. 5A-5E depict the results of respective steps in the flow-chart of FIG. 5. FIGS. 5A-5E are particularly directed to forming a metal film and photoresist film on the piezoelectric vibrating piece, removing selected regions of the photoresist film, and etching exposed regions of the metal film to form the stepped edges.

FIG. 6 is a flow-chart of a third portion of the method embodiment, continued from FIG. 5.

FIGS. 6A-6E depict the results of respective steps in the flow-chart of FIG. 6, and depict the results of respective steps in mesa process etching.

FIGS. 8A-8D depict the results of respective steps in the flow-chart of FIG. 8, particularly showing formation of electrodes.

DETAILED DESCRIPTION

Various embodiments are described below with reference to the accompanying drawings. It will be understood that the scope of the present invention is not limited to the described embodiments unless otherwise stated.

First Embodiment of Piezoelectric Vibrating Piece

Figure 1A:
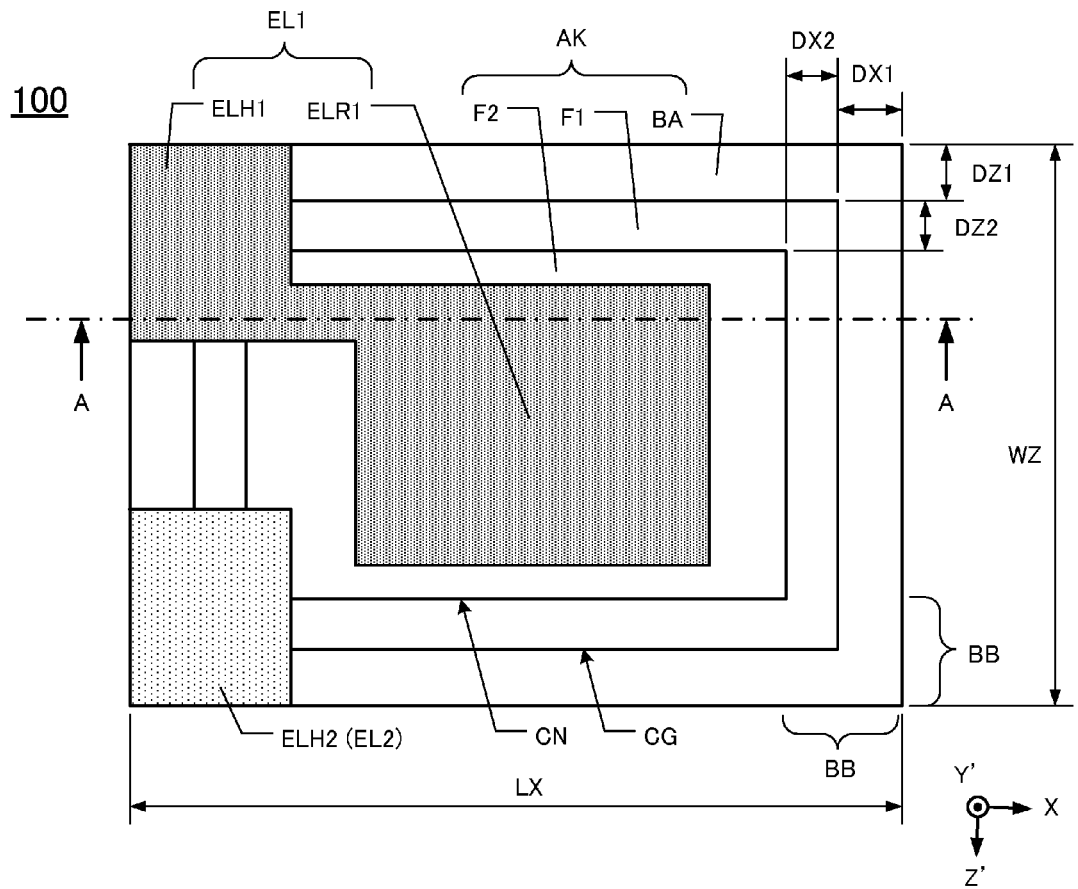
FIG. 1A is a plan view of a piezoelectric vibrating piece formed according to a first embodiment of the subject method.
Figure 1B:
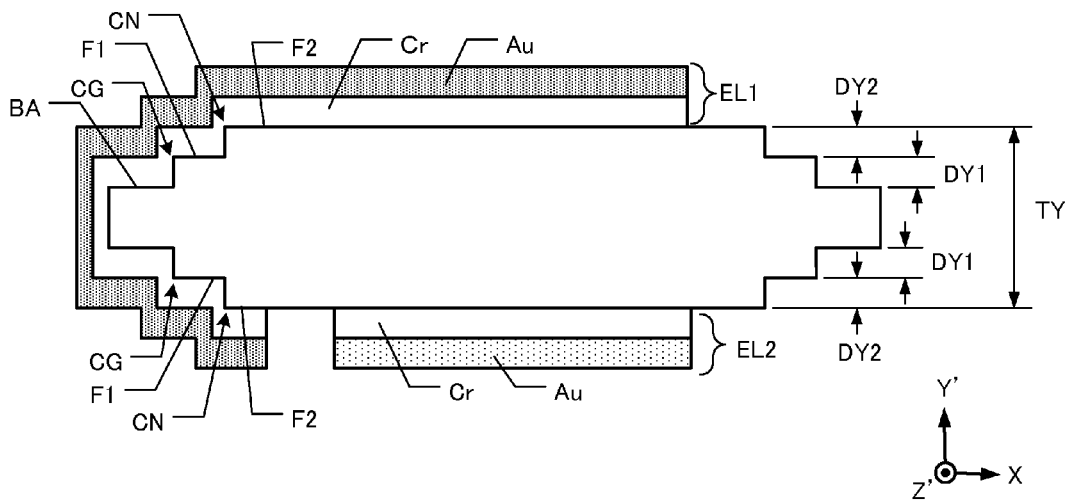
FIG. 1B is an elevational section along the line A-A in FIG. 1A.

FIGS. 1A and 1B depict features of a first embodiment 100 of a piezoelectric vibrating piece. FIG. 1A is a plan view, and FIG. 1B is an elevational section along the line A-A in FIG. 1A. The piezoelectric vibrating piece 100 oscillates at a frequency of 4 MHz, for example, and comprises an AT-cut crystal that vibrates in thickness shear in the X-axis direction. In an XYZ coordinate system as shown, in an AT-cut crystal the main surface of the crystal piece 100 orthogonal to the Y-axis rotates about 35' 15" around the X-axis from the Y-axis direction to the Z-axis direction. The piezoelectric vibrating piece 100 has a rectangularly shaped planar main surface having a thickness in the Y'-axis direction. In this description, the length of the piezoelectric vibrating piece 100 extends in the X-axis direction, and the width is in the Z'-axis direction.

Exemplary dimensions of the piezoelectric vibrating piece 100 are length LX (in the plan profile) of about 5.25 mm, width WZ of about 1.80 mm, and thickness TY (see FIG. 1B) of about 0.42 mm. The piezoelectric vibrating piece 100 is a mesa-type piezoelectric vibrating piece having a rectangular main surface and that is made from a piezoelectric substrate AK. The central region is thicker than the outer edge of the piezoelectric substrate AK. In other words, around the peripheries of the upper and lower surfaces of the piezoelectric substrate AK are stepped regions BB that become progressively thinner with decreased distance to the peripheral edge of the piezoelectric substrate AK. The stepped regions BB comprise two steps of different height: a first (or outer) step CG inboard of the peripheral edge and a second (or inner) step CN inboard of the first step. Extending outward from the first step CG of the piezoelectric substrate AK is a base region BA. Extending outward from the step CN of the piezoelectric substrate AK is a first mesa step F1. Extending outward from the second step CN is a second mesa step F2.

The plan profile of the first mesa step F1 is smaller than the plan profile of the base region BA, wherein the base region has a dimension DX1 in the X-axis direction and a dimension DZ1 in the Z'-axis direction. The plan profile of the second mesa step F2 is smaller than the plan profile of the first mesa step F1, wherein the first mesa step F1 has a dimension DX2 in the X-axis direction and a dimension DZ2 in the Z'-axis direction. Respective values of DX1, DX2, DZ1, and DZ2 range from about 1 to about 10 μm.

As shown in FIG. 1B, the first mesa step F1 projects in the +Y'-axis direction and the −Y'-axis direction from the base region BA, and the second mesa step F2 is projects in the +Y'-axis direction and the −Y'-axis direction from the first mesa step F1. The height of the first mesa step F1, in each of these directions, from the base region BA is denoted DY1, and the height of the second mesa step F2, in each of these directions, from the first mesa step F1 is denoted DY2. The respective heights DY1 and DY2 are in the range of about 1 to 10 µm.

The piezoelectric vibrating piece 100 includes a first excitation electrode ELR1 on the surface of the second mesa step F2 on the +Z'-axis side thereof, and includes a second excitation electrode ELR2 on the surface of the second mesa step F2 on the −Z'-axis side thereof. Whenever an appropriate voltage is applied across the excitation electrodes ELR1, ELR2, thickness shear vibration of the piezoelectric vibrating piece 100 is induced in the X-axis direction. The excitation electrodes ELR1, ELR2 connect to respective outer electrodes, and also connect to respective extraction electrodes ELH1, ELH2 formed near the periphery of the piezoelectric vibrating piece 100. The excitation electrode ELR1 and extraction electrode ELH1 collectively constitute a first electrode EL1, and the excitation electrode ELR1 and extraction electrode ELH2 collectively constitute a second electrode EL2. The electrodes EL1, EL2 are symmetrically placed on the upper and lower surfaces, respectively, of the piezoelectric vibrating piece 100.

The electrodes EL1, EL2 each comprise a chromium (Cr) layer and a gold (Au) layer. Since it is difficult to form the Au layer directly on the piezoelectric substrate AK, the Cr layer is formed on the piezoelectric substrate AK and the Au layer is formed on the Cr layer.

By providing the step regions BB around the periphery of the piezoelectric vibrating piece 100, vibration energy formed on the piezoelectric substrate AK is confined to a central planar region and the crystal impedance (CI) is increased. The step regions BB also reduce unnecessary modes such as face shear.

First Embodiment of a Piezoelectric Vibrator

This embodiment of a piezoelectric vibrator 1000 comprises the piezoelectric vibrating piece 100 contained within a package. The piezoelectric vibrator 1000 is described below with reference first to FIG. 2A, which is an elevational section. Specifically, the piezoelectric vibrator 1000 comprises the piezoelectric vibrating piece 100, a package PK, and a lid LD. The package PK is a concave box comprising sides SB and a base BS. The package PK and lid LD are made of glass, ceramic, or crystal material (e.g., quartz crystal). The lid LD is bonded to the package PK using a sealing material SG, thereby forming a sealed package PK. The piezoelectric vibrating piece 100 is affixed to respective connecting electrodes SD formed at respective locations inside the package PKG via the first and second extraction electrodes ELH1 and ELH2, using an electrically conductive adhesive. The electrodes EL1, EL2 are electrically connected to respective connecting electrodes SD. The connecting electrodes SD are electrically connected to respective external electrodes GD formed at respective locations outside the package PK via conductive wiring (not shown) that fully penetrates the package PK. Thus, the electrodes EL1, EL2 are electrically connected to the external electrode GD.

Figure 2A:
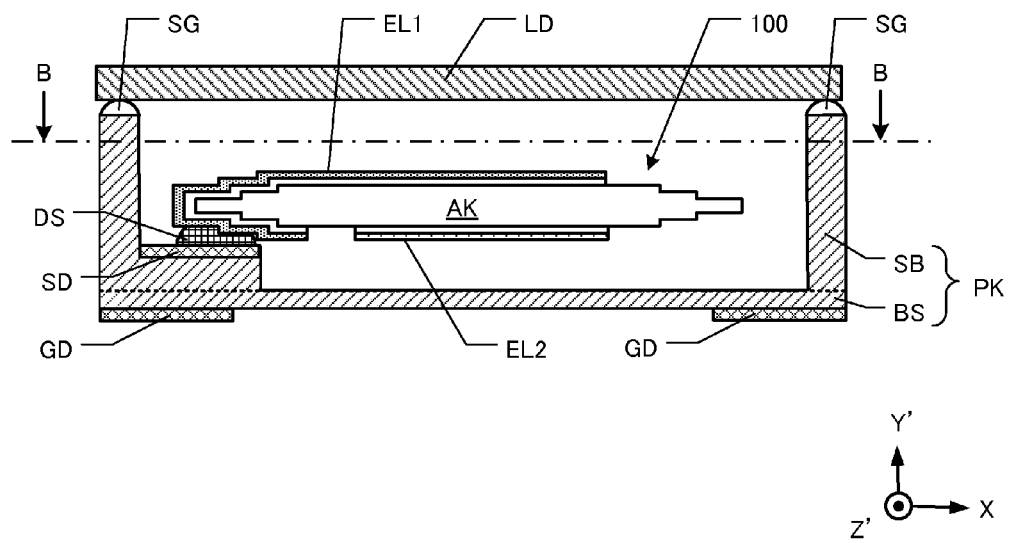
FIG. 2A is an elevational section of a piezoelectric vibrator containing the piezoelectric vibrating piece shown in FIG. 1A.
Figure 2B:
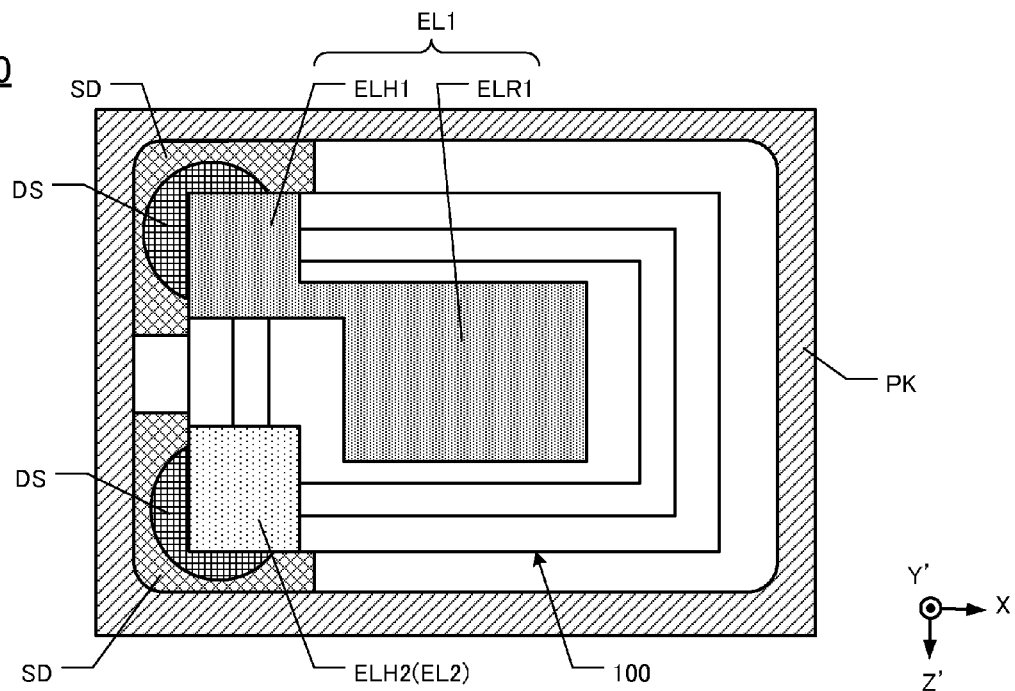
FIG. 2B is a horizontal sectional view along the line B-B of FIG. 2A.

FIG. 2B is a plan section of the piezoelectric vibrator 1000 along the line B-B in FIG. 2A. Two connecting electrodes SE are provided inside the package PK. The respective extraction electrode ELH1 of the first electrode EL1 and the respective extraction electrode ELH2 of the second electrode EL2 are connected to respective connecting electrodes SD through the electrically conductive adhesive DS. To cause vibration of the piezoelectric vibrating piece 100, a voltage is applied across the excitation electrodes ELR1, ELR2 via respective connecting electrodes SD.

Embodiment of Method for Manufacturing the Piezoelectric Vibrating Piece

Figure 3A:
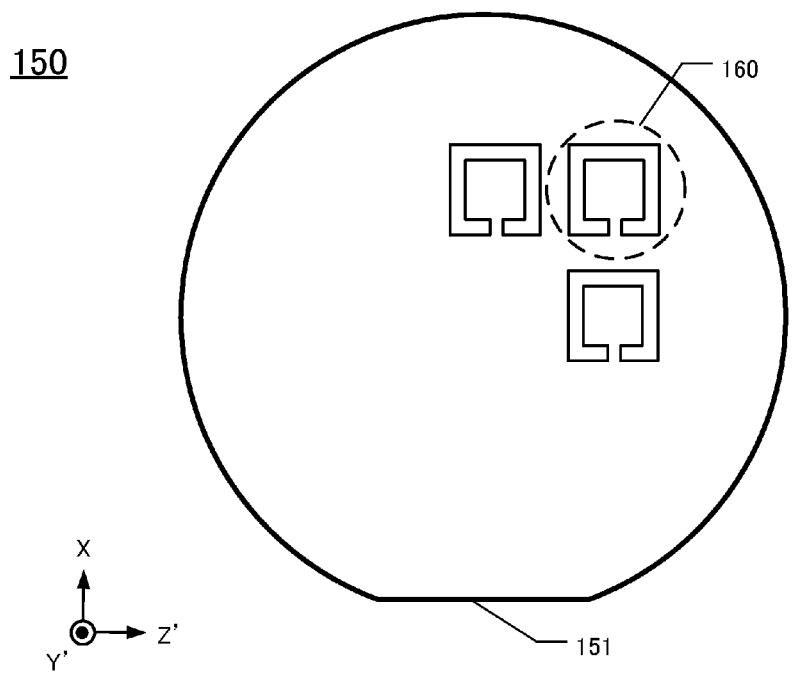
FIG. 3A is a plan view of a piezoelectric wafer in which exemplary "through-grooves" have been formed.

The piezoelectric vibrating piece 100 is formed by forming patterns of a piezoelectric vibrating piece 100 on a piezoelectric wafer 150 made of a piezoelectric material. FIG. 3A is a plan view of the piezoelectric wafer 150. An orientation flat 151 for defining a crystal direction is formed at a particular location on the peripheral edge of the piezoelectric wafer 150. The piezoelectric wafer 150 is made, for example, of a synthetic crystal having a thickness of about 0.42 mm and a diameter of 3 inches or 4 inches. A plurality of piezoelectric vibrating pieces 100 as formed on the piezoelectric wafer 150. FIG. 3A shows three piezoelectric vibrating pieces 100 being formed as an example of multiple piezoelectric vibrating pieces. Inside each dashed circle 160 is a respective piezoelectric vibrating piece 100.

Figure 3B:
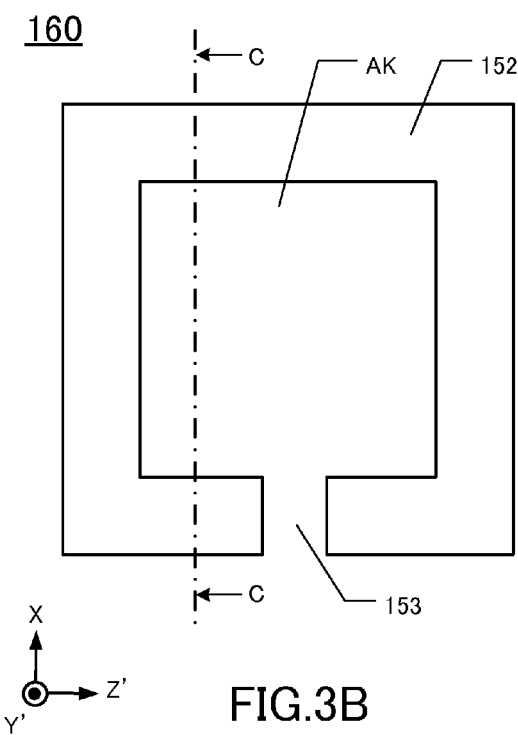
FIG. 3B is an enlargement of the region in the circle denoted "160" in FIG. 3A.

FIG. 3B is an enlarged plan view of the frame 160 located within the dashed circle shown in FIG. 3A. In the method a planar piezoelectric vibrating piece 100 is formed by first forming a penetrating groove 152 which penetrates fully through the thickness dimension (X-axis direction) of the piezoelectric wafer 150. At this point, the piezoelectric vibrating piece 100 is still connected to the piezoelectric wafer 150 by the connecting portion 153. Many piezoelectric vibrating pieces 100 are manufactured simultaneously by first forming the electrodes EL1, EL2 and the step regions BB in way in which the piezoelectric vibrating piece 100 and the piezoelectric wafer 150 are connected together.

Figure 3C:
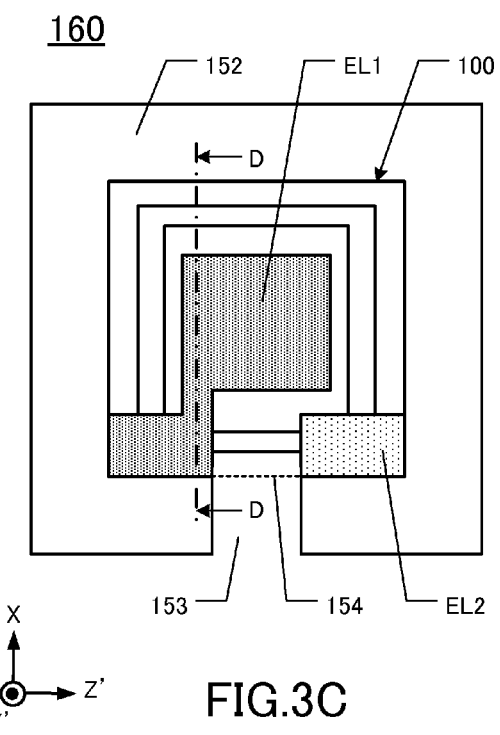
FIG. 3C is a plan view of a piezoelectric vibrating piece connected to the piezoelectric wafer. The vibrating piece has a stepped edge, a first electrode, and a second electrode formed in the method embodiment.

FIG. 3C schematically depicts a piezoelectric vibrating piece 100 on which a step region BB, an electrode EL1, and an electrode EL2 are formed in regions in which the piece 100 must still be connected to the piezoelectric wafer 150. Then, the piezoelectric vibrating piece 100 is removed from the piezoelectric wafer 150 by cutting the piezoelectric wafer 150 along the dicing lines 154 using a dicing saw.

FIGS. 4, 5, 6, and 8 depict respective portions of a flowchart of the subject method, and FIGS. 4A-4F, 5A-5E, 6A-6E, and 8A-8D show the results of respective steps in the flowcharts. The method is directed to manufacture of multiple piezoelectric vibrating pieces 100, such as shown in FIG. 3C, on a single piezoelectric wafer 150. The method includes steps in which a stepped peripheral edge is formed on each piezoelectric vibrating piece. Forming the piezoelectric vibrating pieces begins with providing a bare piezoelectric wafer 150 and forming a respective groove 152 around the intended location of each piezoelectric vibrating piece 100, as shown in FIG. 3B, on the piezoelectric wafer 150. This step is discussed below. FIGS. 5A-5E continue from FIG. 4F, FIGS. 6A-6E continue from FIG. 5E, and FIGS. 8A-8D continue from FIG. 6E.

FIGS. 4A-4F are respective elevational sections along the line C-C in FIG. 3B, and correspond to respective steps shown in FIG. 4. In step S101 a metal film is formed on both surfaces of the piezoelectric wafer 150 by vacuum deposition or sputtering. The metal film comprises a chrome (Cr) layer and a gold (Au) layer. The Cr layer is formed on the surface of the piezoelectric wafer 150, followed by forming the Au layer on the Cr layer, as shown in FIG. 4A. The Cr and Au layers are preferably formed with sufficient thickness to allow etching solution, in a later step, to flow laterally into the edge surfaces thereof. The thickness of each Cr layer desirably is no less than 150 Å, and the thickness of each Au layer desirably is no less than 1000 Å.

In step S102 a photoresist is applied to the Au layers by, e.g., spin-coating. The photoresist layers are converted to respective photoresist films RM by pre-baking the photoresist. The result is shown in FIG. 4B.

In step S103 ultraviolet (UV) light is irradiated on the photoresist films RM through respective photomasks PM1 that define the respective patterns for the penetrating grooves 152. Then, the photoresist films RM on which the penetrating grooves 152 are to be formed are exposed (FIG. 4C). Thus, exposed regions RB are formed on the photoresist film RM wherever penetrating grooves 152 are to be formed.

In step S104 the photoresist film RM is exposed, and the exposed regions RB of the photoresist film RM are removed (FIG. 4D).

In step S105 the Au and Cr layers underlying the exposed regions RB (and now bare as a result of step S104) are removed by etching (FIG. 4E). The Au layers are etched using an aqueous solution of iodine and potassium iodide, and the Cr layers are etched using an aqueous solution of cerium(IV) ammonium nitrate and acetic acid, for example. Corresponding regions of the surface of the piezoelectric wafer 150 become bare wherever the Au and Cr layers have been etched away.

In step S105 the regions of the piezoelectric wafer 150 denuded by removal of the Au and Cr layers are wet-etched using hydrofluoric acid, thus forming the penetrating groove 152 (FIG. 4F). The respective region surrounded by each penetrating groove 152 is a respective piezoelectric substrate AK.

Next, the method progresses to the respective steps shown in the flow-charts of FIGS. 5 and 6 and of which the results are shown in FIGS. 5A-5E and 6A-6E, which show respective elevational sections along the line D-D in FIG. 3C. These steps are directed to forming the step regions BB of the piezoelectric vibrating piece 100.

The flow-chart of FIG. 5 comprises steps of which the results are shown in FIGS. 5A-5E. The steps involve forming metal layers and photoresist films RM on each piezoelectric vibrating piece 100 on the wafer, and removing exposed photoresist film and resulting bare regions of the metal layers to form the step regions BB.

Step S201 follows step S106 (FIG. 4F). In step S201 the photoresist films RM on the piezoelectric substrate AK are removed (FIG. 5A).

In step S202 respective photoresist films are formed on the Au layers using a spray gun. As a result of this step the photoresist film RM is applied to the entire surface of each Au layer and to the edge surfaces of the piezoelectric substrate AK (FIG. 5B).

In step S203 the upper and lower surfaces covered with the photoresist film RM are exposed through a photomask PM2 to form a mesa step region extending around the periphery of the piezoelectric substrate AK. In this step of forming the mesa-step patterns, the corresponding resist pattern RP is formed in the photoresist film RM (FIG. 5C). In FIG. 5C, the regions of the photoresist film RM denoted by hatching are the exposed regions RB. The regions of the photoresist film RM outside the exposed regions RB constitute the resist pattern RP.

In step S204 the exposed photoresist film RM is developed and the exposed regions RB are removed (FIG. 5D).

In step S205 a metal-film pattern is formed by etching the Au layers and then etching the Cr layers (see FIG. 5E). The regions of the metal film (Au layer and Cr layer) that are protected from etching by the resist pattern RP constitute the metal-film pattern KP. Etching the metal films produces corresponding bare regions having widths DX1 and DZ1 at the ±X'-axis sides (see FIG. 1A) of each piezoelectric substrate AK. These bare regions are also formed on the ±X-axis sides of each piezoelectric substrate AK.

Next, steps involving mesa process etching are described with reference to FIG. 6 and corresponding FIGS. 6A-6E. FIG. 6A corresponds to step 301, which follows step S205 (FIG. 5E). In mesa process etching, the regions of the piezoelectric substrate AK that were denuded in step S205 (FIG. 5E) are etched to form the step regions BB on each piezoelectric vibrating piece 100.

In step S301 mesa process etching is performed on the piezoelectric substrate AK using hydrofluoric acid. This mesa process etching forms the first mesa step (having height DY1, width DX1 on the ±X-axis sides and width DZ1 on the ±X'-axis sides) around the periphery of both surfaces of the piezoelectric substrate AK (FIG. 6A). In step S301 the first mesa steps are formed by etching the piezoelectric substrate AK, wherein the metal-film pattern KP is used as an etch-protective film (see FIG. 1A).

Figure 7:
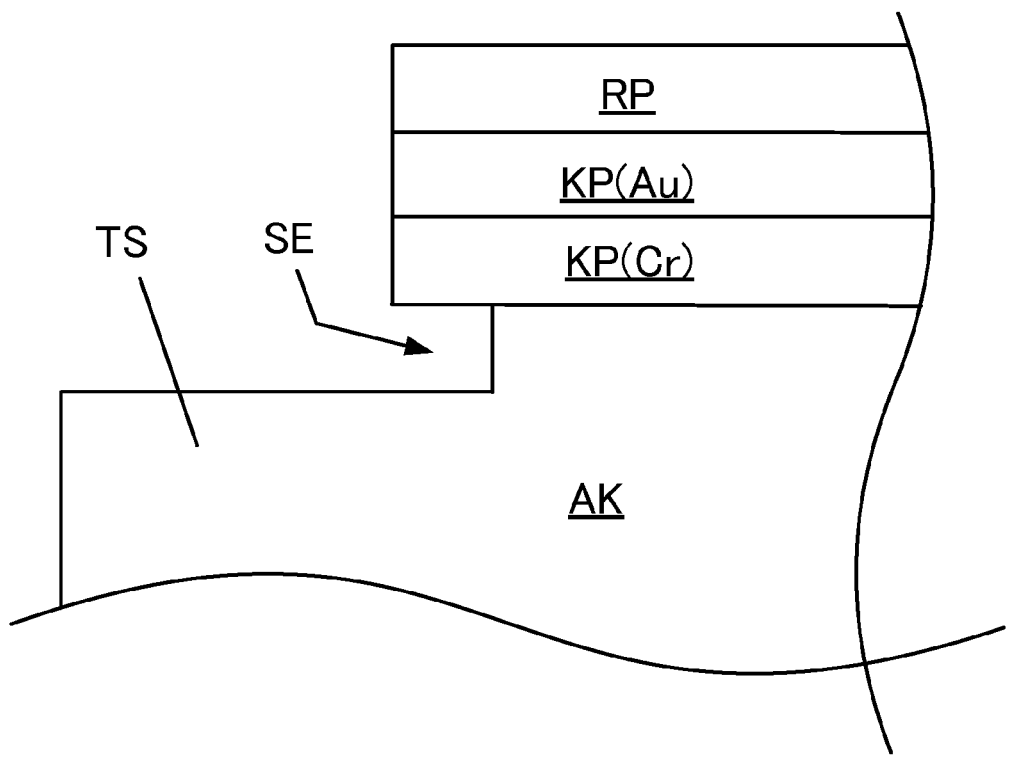
FIG. 7 is an enlarged view of the region 170 shown in FIG. 6A.

FIG. 7 is an enlargement of the region of the piezoelectric substrate AK circumscribed by the dotted circle 170 in FIG. 6A. During mesa process etching in step S301, edge-etched regions SE are formed, in which hydrofluoric acid penetrates laterally to etch slightly the piezoelectric substrate AK under the Cr layer. The resulting denuded dimension of the Cr layer is larger than of the Au layer.

In steps S302 and S303 the metal-film pattern KP is etched edgewise (in the X-axis or Z'-axis direction), but the resist pattern RP remains. In step S302, the Cr layer is edge-etched using an aqueous solution of cerium (IV) ammonium nitrate and acetic acid. The Cr layer is edge-etched even though the Au layer is situated atop the Cr layer (but the edge surface of the Cr layer is denuded). Whenever wet-etching of the Cr layer is performed under such conditions, it progresses inwardly from the edge surface of the Cr layer. The depth of edge-etching of the Cr layer is substantially equal to the width DX2 in the ±X-axis directions (FIG. 6B). In step S303 edge-etching is performed on the Au layer using an aqueous solution of iodine and potassium iodide. The Au layer is edge-etched even though the photoresist film RM is formed atop the Au layer, but while the edge surface of the Au layer is bare. The depth of edge-etching of the Au layer is substantially equal to the width DX2, as obtained during edge-etching the Cr layer (FIG. 6C).

In step S304 mesa process etching is performed on the piezoelectric substrate AK using hydrofluoric acid (FIG. 6D), thereby etching the piezoelectric substrate AK to a depth DY2 in the Y'-axis direction. Thus, the second mesa step F2 (see FIG. 1) is formed.

Upon completing mesa process etching in step S304, the profile of the piezoelectric substrate AK substantially matches the desired edge profile of the piezoelectric vibrating piece 100. Mesa process etching can be repeated as desired to form the mesa step of the step region BB (arrow R1). Thus, the process progresses to step S302 from step S304. According to the number of times that route R1 is taken, the number of mesa steps can be increased.

After forming a desired number of step regions BB, the process advances via route R2 to step S305, in which the resist pattern RP remaining on the piezoelectric substrate AK, the Au layers, and the Cr layers is removed (FIG. 6E). This completes formation of the step portions BB on the piezoelectric substrate AK.

In the steps for forming the step regions BB (steps S201 to S305), the metal film is farmed of Cr and Au. Alternatively, the step regions BB can be formed using only a Cr layer as the metal film. For example, the Cr layer formed in step S201 can be etched in step S205. In step S302 edge etching of the Cr layer is performed. If the metal film comprises only Cr, step S303 is not performed.

Even if both the Cr layer and the Au layer are formed in step S201, only the etching of the Cr layer shown in step S302 (FIG. 6B) need be performed; in other words, it is unnecessary to perform step S303 if: (a) edge etching of the Cr layer is performed after the Au layer has been formed atop the Cr layer, and (b) the photoresist film RM is formed on top of the Au layer as shown in FIG. 6B. Then, etching can be performed from the edge surface of Cr layer inwardly to denude the edge surface of the Cr layer.

The etching of the Cr layer shown in step S302 and the etching of Au layer shown in step S303 can be performed in reverse order. However in step 301, the dimensions of the denuded region of the Cr layer are larger than of the Au layer as shown in FIG. 7, making it easier to etch the Cr layer than the Au layer. Therefore, it is preferable to etch the Au layer after etching the Cr layer by enlarging the denuded area of the Cr layer. If the Au layer is diffused to the Cr layer, a part of the Cr layer may be etched away if the Au layer is etched in advance. It is preferable to etch the Cr layer first to avoid such a situation.

In the foregoing embodiment, the first mesa step is formed in step S301. Alternatively, the first mesa step can be formed after step S106. An edge-etched region SE is situated under the Cr layer (in FIG. 4F a protrusion TS is not formed) on the piezoelectric substrate AK of FIG. 4F, and the dimensions of the denuded area of the Cr layer are larger, making it easier to etch the Cr layer. Therefore, in this alternative sequence, edge-etching of the Cr layer is performed after step S106. Then, the Au layer is edge-etched to denude the peripheries of the upper and lower surfaces of the piezoelectric substrate AK. Then, mesa process etching is performed on the piezoelectric substrate AK to form the mesa steps easily. Further alternatively, the mesa-forming step can be formed only after edge-etching the Cr layer without edge-etching the Au layer.

Figure 8:
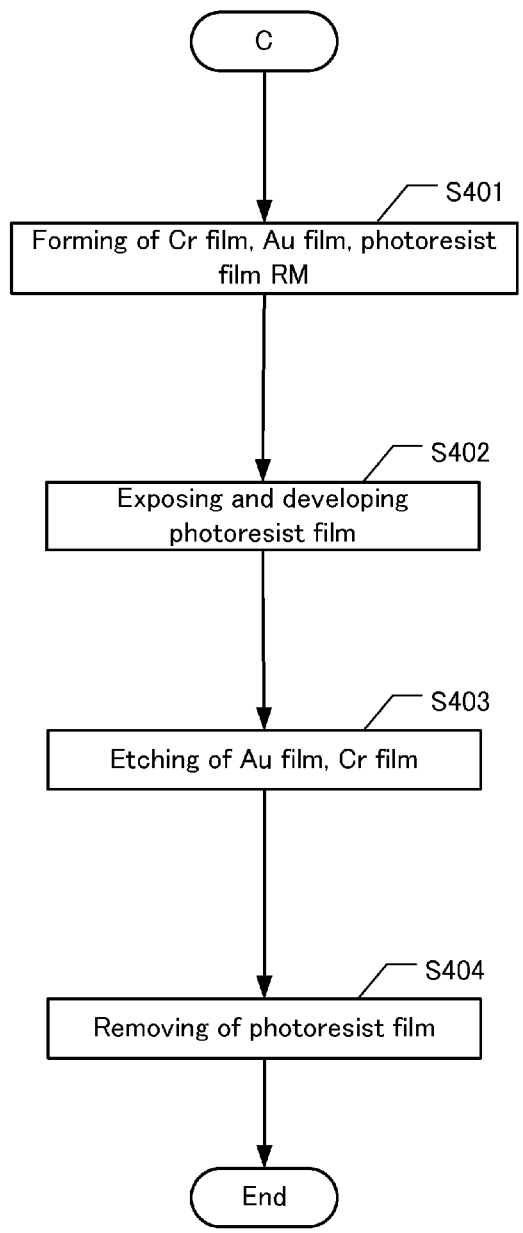
FIG. 8 is a flow-chart of a fourth portion of the method embodiment, continued from FIG. 6.
Figure 8:
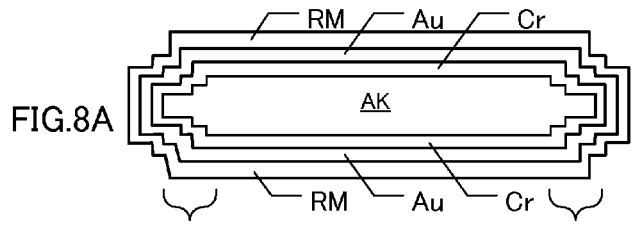
Figure 8:
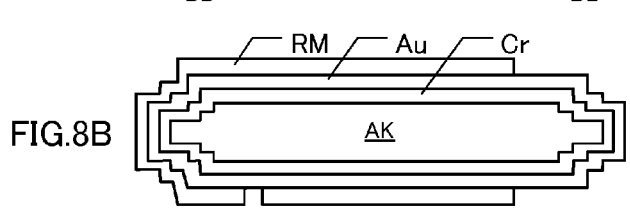
Figure 8:
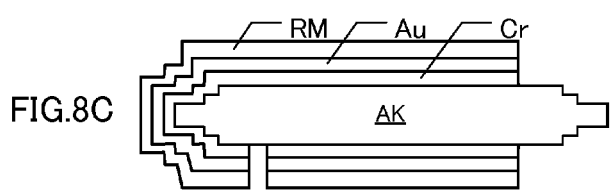
Figure 8:
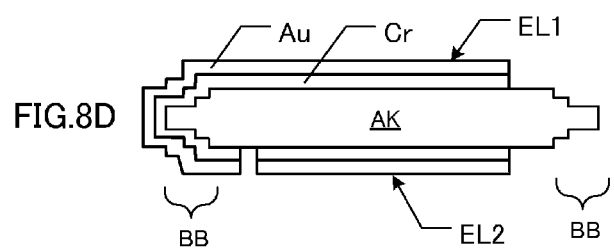
Figure 8:
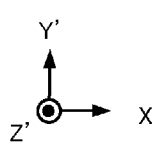

FIG. 8 is a flow-chart of steps for forming electrodes on the piezoelectric vibrating piece 100. The results of respective steps are shown in FIGS. 8A-8D. The electrodes EL1 and EL2 are formed on the piezoelectric substrate AK after the step regions BB have been formed.

Step S401 of FIG. 8 continues from step S305 in FIG. 6. In step S401, a Cr layer is formed on the entire surface (including upper and lower surfaces of the piezoelectric substrate AK, the step regions BB, and the edge surfaces) of the piezoelectric substrate AK. A layer of Au is formed on the entire surface of Cr. Then, a photoresist film RM is formed on the entire surface of Au (FIG. 8A). To form the layers of Cr and Au, vacuum deposition or sputtering can be used. The photoresist film RM can be applied using a spray gun. Desirably the applied photoresist film RM is pre-baked before exposure.

In step S401, the photoresist film RM is exposed and developed using a photomask (not shown) that defines the pattern of the electrode EL1. Thus, the Au layer is patterned with the same profile as the electrode EL1. Since the electrodes EL1 and EL2 are symmetric with each other on the upper and lower surfaces, respectively, of the piezoelectric substrate, the photomask is patterned in the same way for forming the electrodes on both the upper and lower surfaces of the piezoelectric substrate AK (FIG. 8B).

In step S403 the Au and Cr layers are etched according to the photomask. First, regions of the Au layer lacking photoresist RM are etched. Then, regions of the Cr layer denuded of Au film are etched. Remaining are regions of the Au and Cr layers on which the photoresist film RM is not exposed (FIG. 8C).

In step S404 the remaining photoresist film RM is removed. FIG. 8D, an elevational section along the line D-D of FIG. 3C, shows representative regions in which the photoresist film RM has been removed.

In the step sequence described above, the step regions BB on the piezoelectric vibrating piece 100 are formed using a lithographic exposure technique. Thus, compared to using barrel polishing, profile errors during processing can be reduced while suppressing excess variations of characteristic values. During miniaturization of the plan profile of the piezoelectric vibrating piece 100, thinner step regions BB can be formed. Therefore, it is easier to make the excitation electrodes ELR1, ELR2. Further, during barrel polishing, respective electrodes of each piezoelectric vibrating piece 100 are formed one-by-one after the step regions BB have been formed. The method for forming the step regions BB of this embodiment can be utilized to form many electrodes of the piezoelectric vibrating pieces 100 simultaneously because the step regions BB can be formed without any individual detachments from the piezoelectric wafer 150.

Further, during formation of the step regions BB in this embodiment, multiple mesa steps can be formed simultaneously with formation of the Au layer, the Cr layer, and the photoresist film RM. By controlling the amount of etching of the Au and Cr layers in steps S302 and S303, as well as the degree and duration of mesa-etching of the piezoelectric substrate AK in step S304, the width and height of the step regions BB and the number of mesa steps can be controlled. The desired shape and size of the first mesa step F1 in the plane surface can be formed without limitation.

Second Embodiment of Piezoelectric Vibrating Piece

Figure 9A:
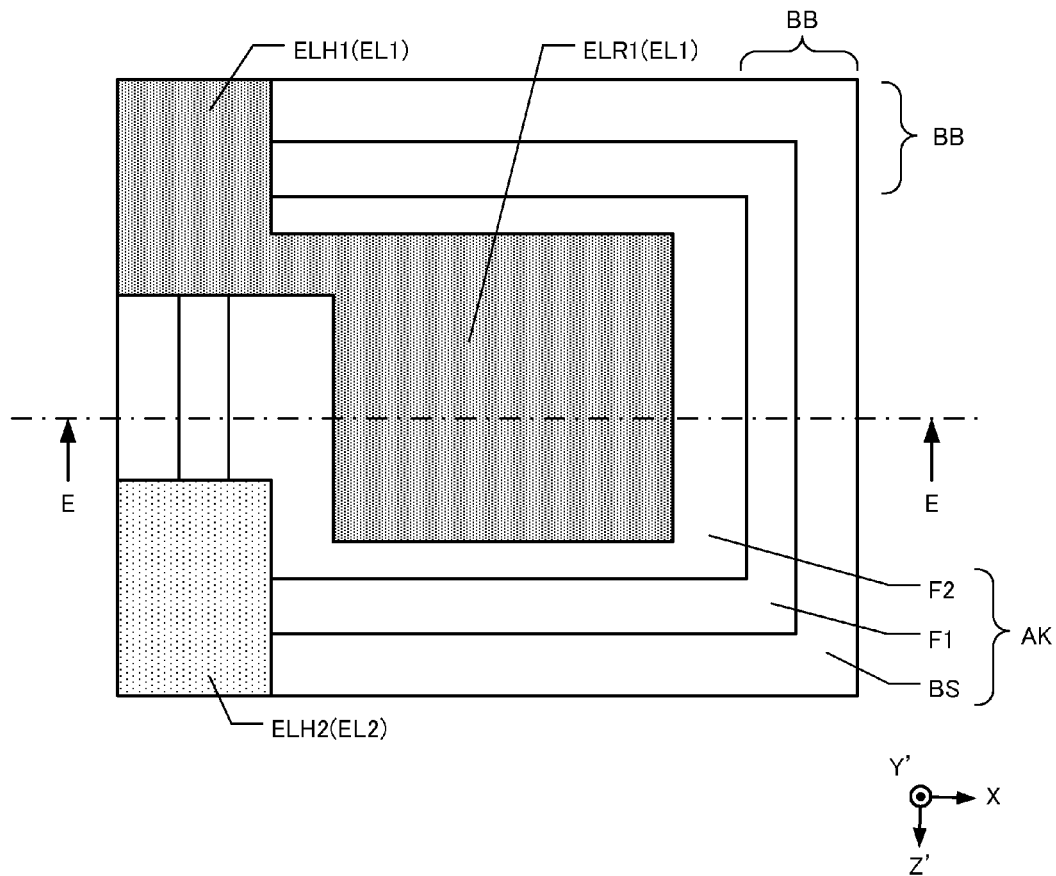
FIG. 9A is a plan view of an embodiment of a piezoelectric vibrating piece formed according to another embodiment of the subject method.
Figure 9B:
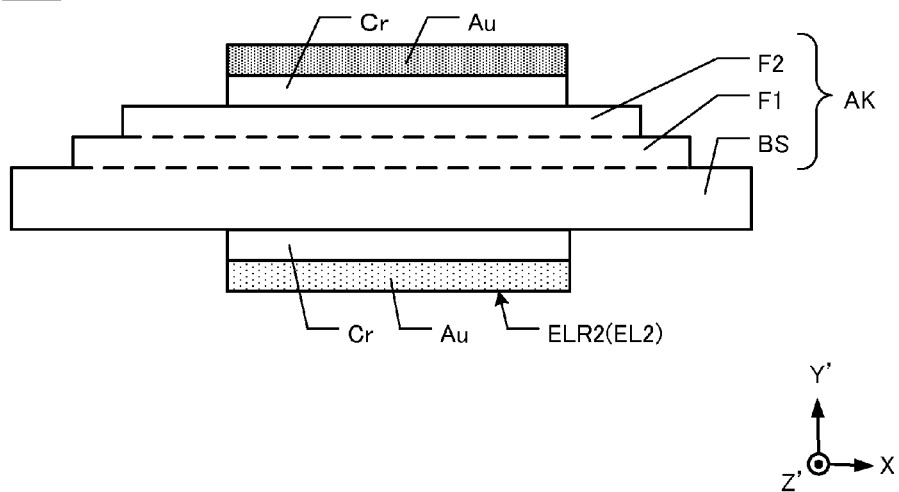
FIG. 9B is an elevational section along the line E-E in FIG. 9A.

In the first embodiment, the same shapes of step regions BB are formed on both the upper and lower surfaces of the piezoelectric vibrating piece 100. Alternatively, different shapes of step regions BB can be formed on the upper and lower surfaces or can be formed only on one surface. FIGS. 9A and 9B depict the second embodiment of a piezoelectric vibrating piece 200 in which the step regions BB are formed on only one surface. FIG. 9A is a plan view of the second embodiment 200. The piezoelectric vibrating piece 200 is an AT-cut crystal vibrating piece that vibrates in thickness shear in the X-axis direction. The same step region BB that was formed on two surfaces of the piezoelectric vibrating piece 100 of the first embodiment is formed on one surface (the +Y'-axis surface) of the piezoelectric vibrating piece 200 of the second embodiment.

FIG. 9B is an elevational section along the line E-E in FIG. 9A. Step regions BB are not formed on the −Y'-facing surface, leaving that surface planar. The excitation electrode ELR2 formed on the −Y'-facing surface has the same shape and size of the excitation electrode ELR1 formed on the +Y'-facing surface.

The piezoelectric vibrating piece 200 has a piano-mesa structure in which the mesa steps are formed on only one surface. Even though the mesa step is formed on only one surface, the mesa step can concentrate vibrational energy under the excitation electrodes sufficiently to lower the CI value, compared to a structure lacking mesa steps entirely.

Method for Manufacturing Second Embodiment of Piezoelectric Vibrating Piece

This manufacturing method is essentially the same as the method, described above, for manufacturing the first embodiment of a piezoelectric vibrating piece 100. In the second embodiment, since the step region BB is on only one surface of the piezoelectric vibrating piece 200, the required fabrication of the surface of the piezoelectric substrate AK can be performed according to the process for forming the step region BB described in connection with FIGS. 5 and 6. Specifically, in the step in which metal layers are formed (step S201 in FIG. 5), the metal film is formed only on the +Y'-facing surface. Thus, in step S202, the photoresist need be applied only on the +Y'-facing surface. Further, in step S203, only the +Y'-facing surface need be exposed.

Third Embodiment of Piezoelectric Vibrating Piece

Figure 10A:
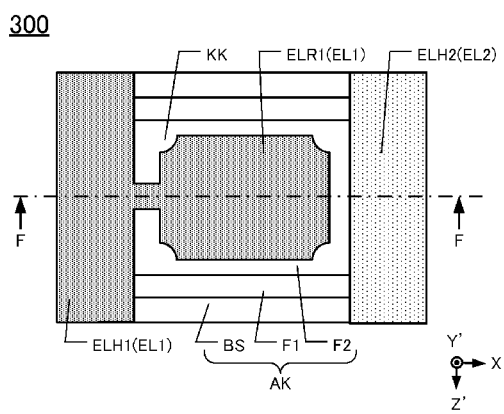
FIG. 10A is a plan view of an embodiment of a piezoelectric vibrating piece formed according to yet another embodiment of the subject method.

FIG. 10A is a plan view of a piezoelectric vibrating piece 300 according to the third embodiment. The piezoelectric vibrating piece 300 is an AT-cut crystal vibrating piece that vibrates in thickness shear in the X-axis direction. The plan profile of the piezoelectric substrate AK of the piezoelectric vibrating piece 300 is the same as the plan profile of the piezoelectric substrate AK of the first embodiment of a piezoelectric vibrating piece 100. The piezoelectric vibrating piece 300 includes both the electrodes EL1 and EL2. Respective excitation electrodes ELR1 and ELR2 are formed on the respective planar regions of the +Y'-facing surface and of the −Y'-facing surface. These electrodes are connected to respective extraction electrodes ELH1, ELH2, wherein the extraction electrode ELH1 is formed on the entire +X-facing surface, and the extraction electrode ELH2 is formed on the entire −X-facing surface. At each of the four corners of the excitation electrodes ELR1, ELR2, respective notches KK are formed in regions in which the electrodes are not formed.

Figure 10B:
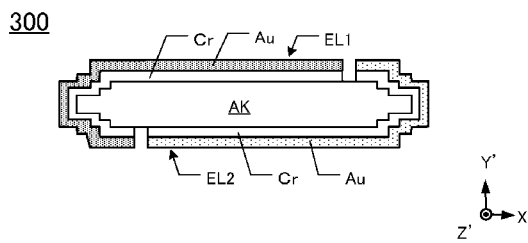
FIG. 10B is an elevational section along the line F-F line in FIG. 10A.

FIG. 10B is an elevational section along the line F-F line of the piezoelectric vibrating piece 300 of FIG. 10A. The electrodes EL1 and EL2 are symmetrical on the upper and lower surfaces of the piezoelectric substrate AK. As with the first embodiment of a piezoelectric vibrating piece 100, each electrode comprises a Cr layer formed on the piezoelectric substrate AK and a Au layer formed on the Cr layer.

The piezoelectric substrate AK of the piezoelectric vibrating piece 300 has the same shape of the piezoelectric substrate AK of the piezoelectric vibrating piece 100, but the electrodes formed on the piezoelectric substrate AK are different in the piezoelectric vibrating piece 300 and the piezoelectric vibrating piece 100. Thus, the electrodes of the piezoelectric vibrating piece 300 are formed by exposing and developing a photoresist film RM using a photomask, as shown in step S402 of FIG. 7.

Figure 10C:
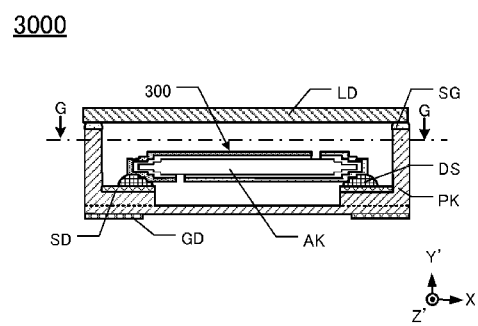
FIG. 10C is an elevational section of a piezoelectric vibrator comprising the vibrating piece shown in FIG. 10A.
Figure 10D:
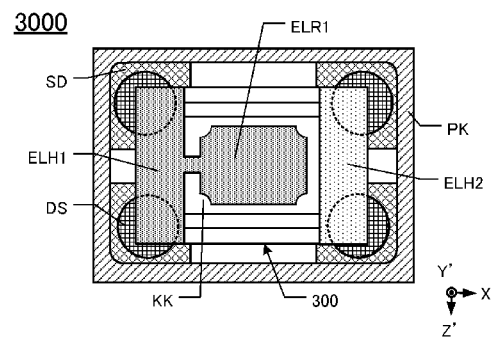
FIG. 10D is a horizontal (coronal) section along the line G-G in FIG. 10C.

FIG. 10C is an elevational section of a piezoelectric vibrator 3000, which comprises a lid LD, a package PK, and the piezoelectric vibrating piece 300. The piezoelectric vibrating piece 300 is affixed to a connection electrode SD in the package PK by electrically conductive adhesive DS. The electrically conductive adhesive SD is electrically connected to the external electrode GD formed outside of the package PK. The lid LD is bonded to the package PK by sealing material SG to seal the package PK.

FIG. 10 D is a horizontal section of piezoelectric vibrator 3000 along the line G-G of FIG. 1C. The piezoelectric vibrating piece 300 is connected to the connecting electrode SD by electrically conductive adhesive DS at both side surfaces (in the ±Z'-axis direction) of respective extraction electrodes ELH1 and ELH2. Thus, the piezoelectric vibrating piece 300 is mounted to the package PK at four points.

By providing a respective notch KK at each of the four corners of the excitation electrodes ELR1 and ELR2 of the piezoelectric vibrating piece 300, a greater distance is provided between the bonding areas of the electrically conductive adhesive DS and the extraction electrodes ELH1, ELH2, and the excitation electrodes ELR1, ELR2. Therefore, if the amount of applied adhesive DS is excessive and/or the piezoelectric vibrating piece 300 is inaccurately aligned as mounted to the package PK, unwanted contact of the electrically conductive adhesive DS with the excitation electrodes ELR1, ELR2 can be prevented. The electrodes are symmetric on both their upper and lower surfaces, which eliminates any directional property in the ±X-axis direction. This makes bonding of the piezoelectric vibrating piece 300 to the connecting electrode 300 easier.

Fourth Embodiment of Piezoelectric Vibrating Piece

Even for a piezoelectric vibrating piece having a frame extending around the piezoelectric substrate AK, a mesa step can be formed in the same manner as described above regarding the piezoelectric vibrating piece 100. A fourth embodiment of a piezoelectric vibrating piece 400 that includes a frame portion WB is explained below.

Figure 11A:
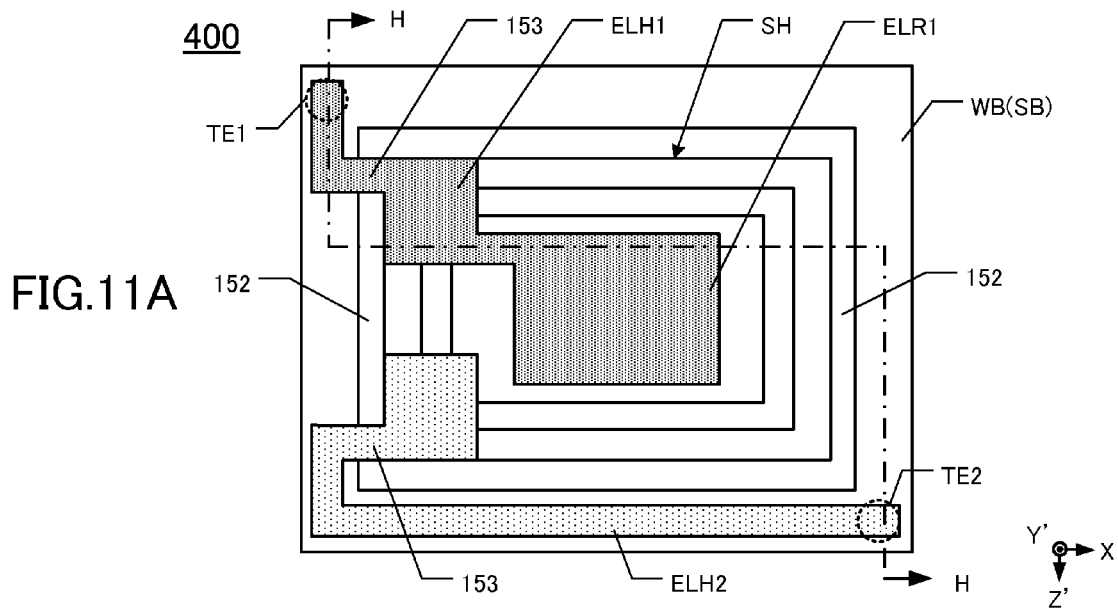
FIG. 11A is a plan view of an embodiment of a piezoelectric vibrating piece formed according to yet another embodiment of the subject method.

FIG. 11A is a plan view of this embodiment of a piezoelectric vibrating piece 400. The piezoelectric vibrating piece 400 is an AT-cut crystal vibrating piece that vibrates in thickness shear in the X-axis direction. The piezoelectric vibrating piece 400 comprises a vibrating portion SH and a frame portion WB. The vibrating portion SH and frame portion WB are connected to each other at two connecting portions 153. The vibrating portion SH has the same shape as the piezoelectric substrate AK of the first embodiment of a piezoelectric vibrating piece 100, and electrodes are attached thereto in the same fashion. The frame portion WB surrounds the vibrating portion SH. When the piezoelectric vibrating piece 400 is mounted in the piezoelectric vibrator 4000, the frame portion WB serves as a side portion SB of the piezoelectric vibrating piece 400. The extraction electrodes ELH1, ELH2 on the vibrating portion SH are formed over respective corners TE1, TE2 of the frame portion WB through the connecting portions 153.

Figure 11B:
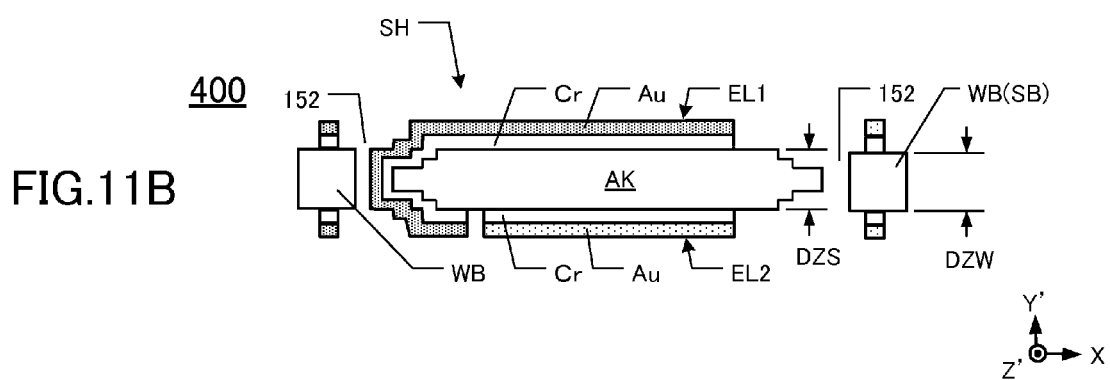
FIG. 11B is an elevational section along the line H-H in FIG. 11A.

FIG. 11B is an elevational section along the line H-H in FIG. 11A. Penetrating grooves 152 are located between the frame portion WB and the vibrating portion SH. The thickness DZW of the frame portion WB can be equal to the thickness DZS of the vibrating portion SH; alternatively, these thicknesses can be different.

Figure 11C:
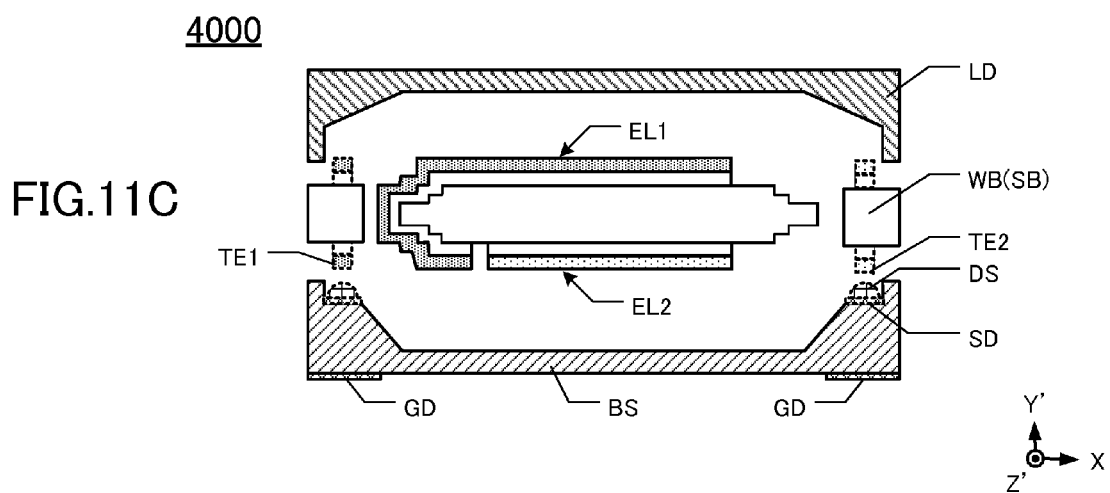
FIG. 11C is an elevational section of an embodiment of a piezoelectric vibrator that is not yet fully assembled.

FIG. 11C is an elevational section showing a piezoelectric vibrator 4000 that has not yet been assembled together. The piezoelectric vibrator 4000 comprises a lid LD, a base BS, and the piezoelectric vibrating piece 400. The extraction electrodes ELH1, ELH2 are connected by electrically conductive adhesive DS to respective connecting electrodes SD, formed on the base BS at the corner TE1 and at the corner TE2, respectively. The lid LD, base BS, and piezoelectric vibrating piece 400 are made of quartz crystal, for example, in which case the lid LD, base BS, and piezoelectric vibrating piece 400 can be bonded together by siloxane (Si—O—Si) bonding. The siloxane bonding technique bonds crystal pieces together directly.

The piezoelectric vibrating piece 400 can be manufactured in substantially the same manner as in manufacturing the piezoelectric vibrating piece 100 of the first embodiment (FIGS. 4-7). However, in the step involving formation of the profile of the piezoelectric substrate, a groove 152 is formed that separates the vibrating portion SH from the frame portion WB. In step S203 of FIG. 5, if the photoresist film RM of the frame portion WB is also exposed, the thickness DZW of the frame portion WB can be reduced. If the photoresist film RM of the frame portion is not exposed, the frame portion WB can have the same thickness as the piezoelectric wafer 150.

The lid LD, package PK, or base BS of the four embodiments described above can be formed of glass, ceramic, or a crystal material (e.g., quartz crystal). Crystal is preferred for the following reasons:

One of the indicators of hardness of industrial materials is the "Knoop hardness number." Higher Knoop hardness numbers denote greater hardness than lower Knoop hardness numbers. The Knoop hardness of borosilicate glass, which is commonly used for the lid LD, the package PKG, and base BS, is 590 kg/mm$^2$, and the Knoop hardness of quartz crystal is 710 to 790 kg/mm$^2$. Thus, using crystal instead of glass for the lid LD, the package PKG, and base BS provides the piezoelectric vibrator with higher degrees of hardness. If glass is used to fabricate the lid LD, the package PKG, and base BS, the glass must be correspondingly thicker to meet hardness specifications. But, if crystal is used instead, then a thinner profile (in the Z-axis direction) can be achieved. I.e., whenever crystal is used for making the lid LD, the package PKG, and base BS for a piezoelectric vibrator having the same degree of hardness as glass, the size of piezoelectric vibrator can be correspondingly miniaturized and have a thinner profile.

Whenever a crystal unit is being manufactured or being attached to a printed circuit board, heat is applied to the piezoelectric vibrator. If different materials are used for making the lid LD, the package PKG, and base BS, the interior of the piezoelectric vibrator becomes stressed due to differences in thermal expansion coefficients of the two different materials. If the differences in thermal-expansion coefficients are sufficiently large, the correspondingly large stress may actually cause fracture of corners of the frame portion WB of the piezoelectric vibrating piece 400 of the fourth embodiment. Therefore, it is desirable to narrow the differences in thermal-expansion coefficients between the lid LD and base BS, and the piezoelectric vibrating piece 400. It is also desirable to use a crystal material for the lid LD and the base BS because, compared to a package made using glass, the difference in thermal expansion coefficient posed by the piezoelectric vibrating piece 400 can be narrowed to reduce the stress inside the piezoelectric vibrator. Also, use of a crystal material allows greater miniaturization or a thinner profile of the piezoelectric vibrator compared to one made from glass.

The invention has been described above in the context of preferred embodiment It will be obvious to persons of ordinary skill in the relevant art to modify the invention based on this disclosure.

For example, in the various described embodiments, the piezoelectric material for the piezoelectric substrate AK is described as a crystal material. This is not intended to be limiting. A crystal material is but one example of a suitable material, and LiTaO$_3$ (lithium tantalite) can be used instead of a crystal material for the piezoelectric material. Also, silver (Ag) can be used instead of gold (Au), and nickel (Ni), titanium (Ti), or tungsten (W) can be used instead of chrome (Cr).

Also, although the foregoing descriptions were in the context of an AT-cut crystal vibrating piece, the crystal vibrating piece alternatively can be a BT-cut crystal piece. Besides use in a piezoelectric vibrator as an exemplary piezoelectric device, the piezoelectric vibrating piece can be used in a piezoelectric oscillator comprising an integrated circuit IC including an oscillator circuit.

What is claimed is:

1. A method for manufacturing a piezoelectric vibrating piece, comprising:
    on each surface of a piezoelectric wafer, forming a respective metal film;
    on the piezoelectric wafer, forming a through-groove that defines outer edges of a piezoelectric substrate, the piezoelectric substrate including a first main surface, a second main surface, and respective peripheral regions extending from each main surface to respective edges;
    forming a film of resist on the metal film on at least one main surface of the piezoelectric substrate;
    exposing the resist through a photomask that defines a resist pattern for a first mesa step in at least one peripheral region on the main surface, thereby forming the resist pattern;
    using the resist as an etch-protectant, etching the metal film to form a metal-film pattern;
    using the metal-film pattern as an etch-protective film, etching the piezoelectric substrate a first depth to form a first mesa step and denuded edges of the metal film, the first mesa step being inboard of the respective outer edge;
    further using the resist as an etch-protectant, edge-etching the denuded edges of the metal film under the resist a defined distance to produce corresponding denuded regions of the piezoelectric substrate; and
    using the metal-film pattern as an etch-protectant, etching the denuded regions of the piezoelectric substrate a second depth to form a second mesa step located inboard of the first mesa step, such that the piezoelectric substrate becomes step-wise thinner from the main surfaces to the second mesa step to the first mesa step.

2. The method of claim 1, wherein each metal film comprises a first metal layer formed on the respective main surface of the piezoelectric substrate and a second metal layer formed on the first layer.

3. The method of claim 2, wherein etching the metal film comprises etching the first metal layer and then etching the second metal layer.

4. The method of claim 3, further comprising forming multiple second mesa steps by repeating, at least once, the steps of edge-etching the metal film and etching denuded regions of the piezoelectric substrate.

5. The method of claim 3, wherein the steps of forming the resist pattern, exposing the resist, etching the metal film, etching the piezoelectric substrate, edge-etching the denuded edges of the metal film, and etching the denuded regions of the piezoelectric substrate are performed on only the first main surface of the piezoelectric substrate.

6. The method of claim 3, further comprising, after forming the second mesa step and while the piezoelectric substrate is attached to the piezoelectric wafer, forming an excitation electrode on the piezoelectric substrate.

7. The method of claim 2, wherein etching the metal film comprises etching only the first metal layer.

8. The method of claim 7, further comprising forming multiple second mesa steps by repeating, at least once, the steps of edge-etching the metal film and etching denuded regions of the piezoelectric substrate.

9. The method of claim 7, wherein the steps of forming the resist pattern, exposing the resist, etching the metal film, etching the piezoelectric substrate, edge-etching the denuded edges of the metal film, and etching the denuded regions of the piezoelectric substrate are performed on only the first main surface of the piezoelectric substrate.

10. The method of claim 7, further comprising, after forming the second mesa step and while the piezoelectric substrate is attached to the piezoelectric wafer, forming an excitation electrode on the piezoelectric substrate.

11. The method of claim 2, further comprising forming multiple second mesa steps by repeating, at least once, the steps of edge-etching the metal film and etching denuded regions of the piezoelectric substrate.

12. The method of claim 2, wherein the steps of forming the resist pattern, exposing the resist, etching the metal film, etching the piezoelectric substrate, edge-etching the denuded edges of the metal film, and etching the denuded regions of the piezoelectric substrate are performed on only the first main surface of the piezoelectric substrate.

13. The method of claim 2, further comprising, after forming the second mesa step and while the piezoelectric substrate is attached to the piezoelectric wafer, forming an excitation electrode on the piezoelectric substrate.

14. The method of claim 1, further comprising forming multiple second mesa steps by repeating, at least once, the steps of edge-etching the metal film and etching denuded regions of the piezoelectric substrate.

15. The method of claim 1, wherein the steps of forming the resist pattern, exposing the resist, etching the metal film, etching the piezoelectric substrate, edge-etching the denuded edges of the metal film, and etching the denuded regions of the piezoelectric substrate are performed on only the first main surface of the piezoelectric substrate.

16. The method of claim 1, further comprising, after forming the second mesa step and while the piezoelectric substrate is attached to the piezoelectric wafer, forming an excitation electrode on the piezoelectric substrate.

17. A method for manufacturing a piezoelectric vibrating piece including a piezoelectric substrate made of a piezoelectric material and including an excitation electrode formed on a main surface of the piezoelectric substrate, the method comprising:

forming a first metal layer on a main surface of a piezoelectric wafer;

forming a second metal layer on the first metal layer, thereby forming a metal film on the main surface;

forming a through-groove, extending through a thickness dimension of the wafer, that defines edges of a piezoelectric substrate attached to the wafer and that exposes edge surfaces of the metal film along the edges of the substrate, the substrate including respective peripheral regions located adjacent the edges;

edge-etching the edge surface of the first metal layer under the second metal layer to denude at least one respective peripheral region of the substrate while retaining the second metal layer; and using remaining metal film as an etch-protective film, etching the at least one denuded peripheral region to form a respective first mesa step.

18. The method of claim 17, further comprising, after edge-etching the first metal layer but before etching the at least one denuded peripheral region, edge-etching the second metal layer.

19. The method of claim 17, further comprising repeating, at least once, the steps of etching the first metal layer and edge-etching the at least one denuded peripheral region to form multiple mesa steps.

* * * * *